United States Patent
Vakilian

[19]

[11] Patent Number: 6,160,718
[45] Date of Patent: Dec. 12, 2000

[54] MULTI-CHIP PACKAGE WITH STACKED CHIPS AND INTERCONNECT BUMPS

[75] Inventor: Kavous Vakilian, Laguna Hills, Calif.

[73] Assignee: Viking Components, Rancho Santa Margarita, Calif.

[21] Appl. No.: 09/207,490

[22] Filed: Dec. 8, 1998

[51] Int. Cl.[7] .................................. H05K 1/18; H05K 7/06
[52] U.S. Cl. ................... 361/803; 361/761; 361/764; 361/767; 361/777; 257/686; 257/723; 257/777; 365/51
[58] Field of Search .................................. 361/761, 764, 361/767, 768, 783, 803, 777; 257/680, 686, 723, 724, 737, 738, 777; 439/68; 365/51

[56] References Cited

U.S. PATENT DOCUMENTS

| | | | |
|---|---|---|---|
| 5,012,323 | 4/1991 | Farnworth | 257/723 |
| 5,241,456 | 8/1993 | Marcinkiewicz et al. | 257/686 |
| 5,299,094 | 3/1994 | Nishino et al. | 257/686 |
| 5,394,300 | 2/1995 | Yoshimura | 257/686 |
| 5,396,102 | 3/1995 | Toshio et al. | 257/723 |
| 5,412,538 | 5/1995 | Kikinis et al. | 361/792 |
| 5,471,369 | 11/1995 | Honda et al. | 174/52.2 |
| 5,661,339 | 8/1997 | Clayton | 257/723 |
| 5,744,862 | 4/1998 | Ishii | 257/686 |
| 5,754,408 | 5/1998 | Derouiche | 257/777 |
| 5,798,564 | 8/1998 | Eng et al. | 257/686 |
| 5,936,305 | 8/1999 | Akram | 257/723 |
| 5,956,233 | 9/1999 | Yew et al. | 257/686 |
| 5,977,640 | 11/1999 | Bertin et al. | 257/777 |
| 5,998,865 | 12/1999 | Akram | 257/723 |
| 6,008,538 | 12/1999 | Akram et al. | 257/723 |
| 6,072,699 | 6/2000 | Horine | 361/777 |

FOREIGN PATENT DOCUMENTS

| | | |
|---|---|---|
| 0 586 069 A2 | 3/1994 | European Pat. Off. . |
| 196 48 728 A1 | 10/1997 | Germany . |
| 197 21 967 A1 | 6/1998 | Germany . |
| 56-50844 | 11/1981 | Japan . |
| 4-335561A | 11/1992 | Japan . |

*Primary Examiner*—Jeffrey Gaffin
*Assistant Examiner*—John B. Vigushin
*Attorney, Agent, or Firm*—Oppenheimer Wolff & Donnelly, LLP

[57] ABSTRACT

A multi-chip package includes a substrate having an opening about the central region. At least two integrated circuit chips are mounted on the substrate. The first chip is connected to one side of the substrate, while the second chip is connected to the other side of the substrate. At least a portion of one of the chips is positioned within the opening, and the chips are vertically stacked. The bottom side of the substrate includes a plurality of interconnect bumps for providing electrical connection to a circuit board or other substrate.

23 Claims, 7 Drawing Sheets

FIG. 4A
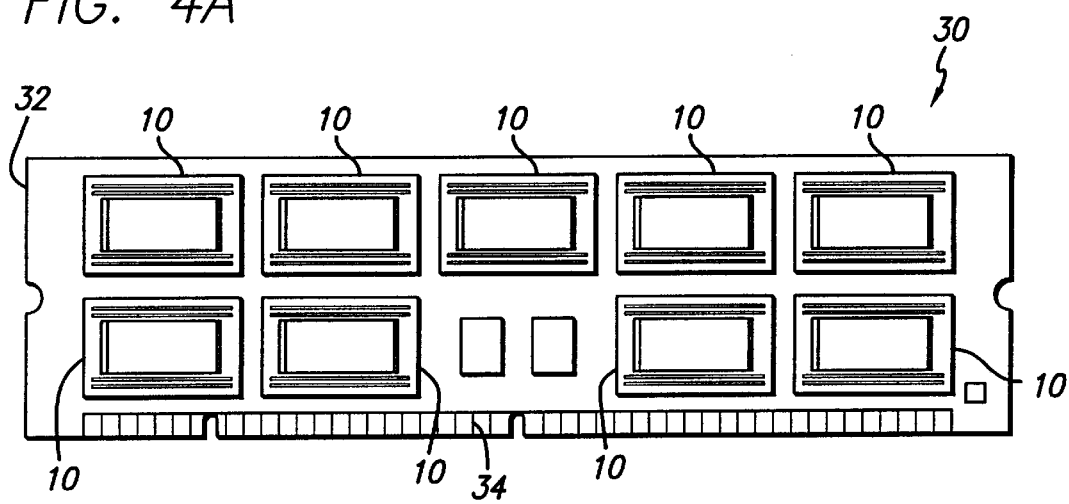
FIG. 4B
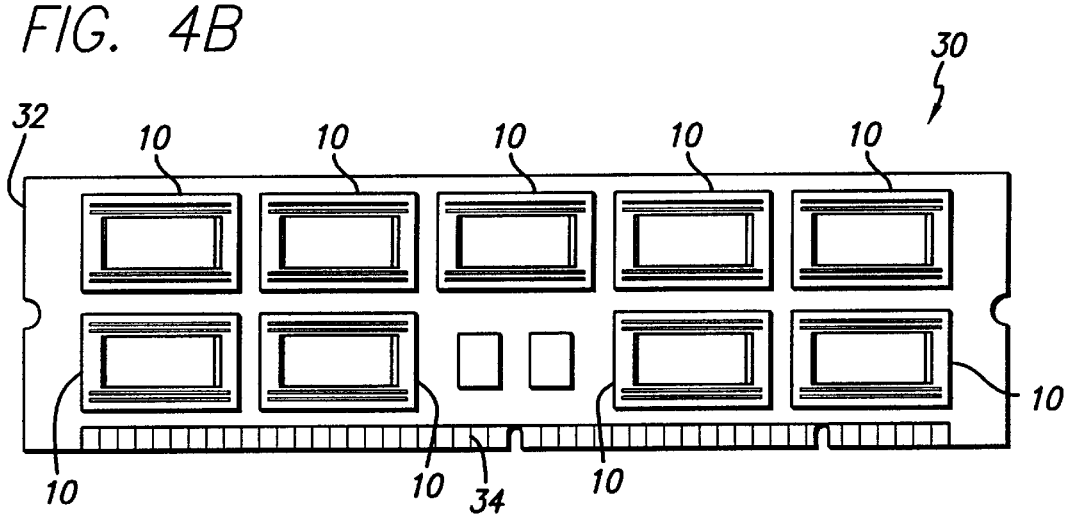
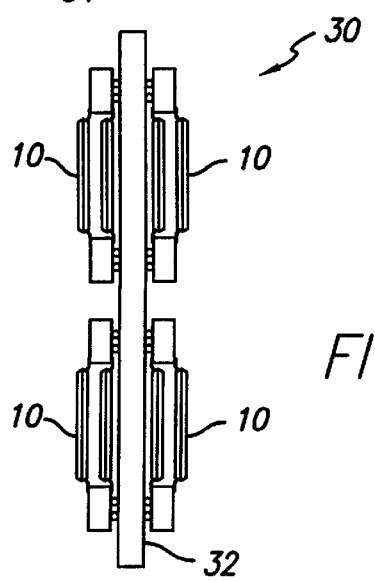
FIG. 4C

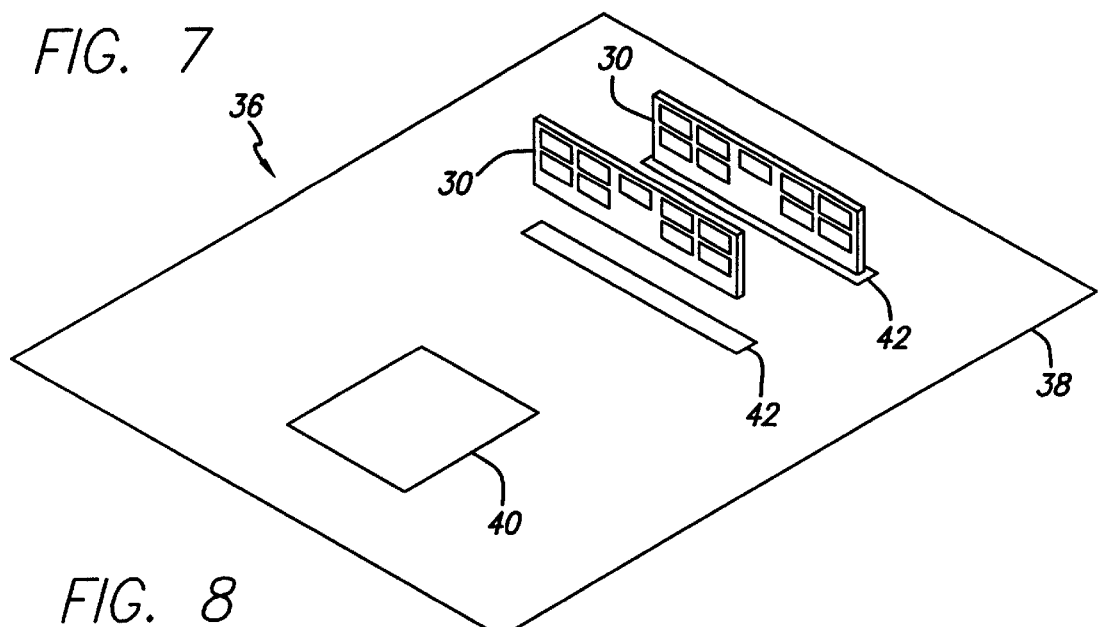
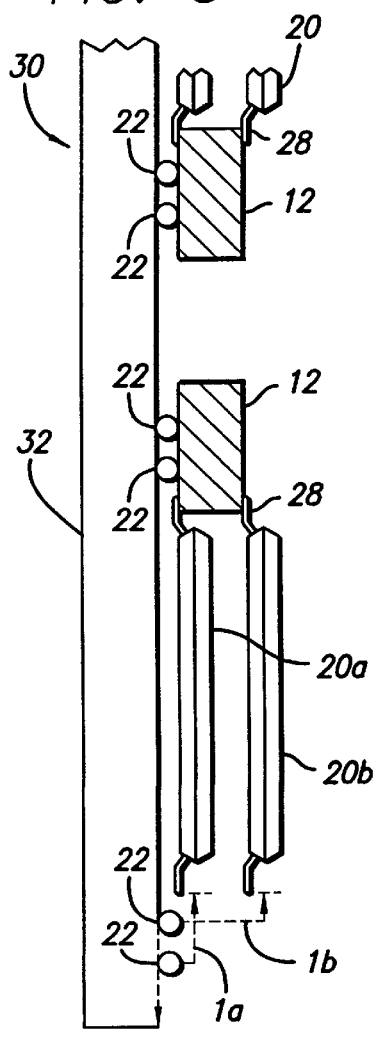
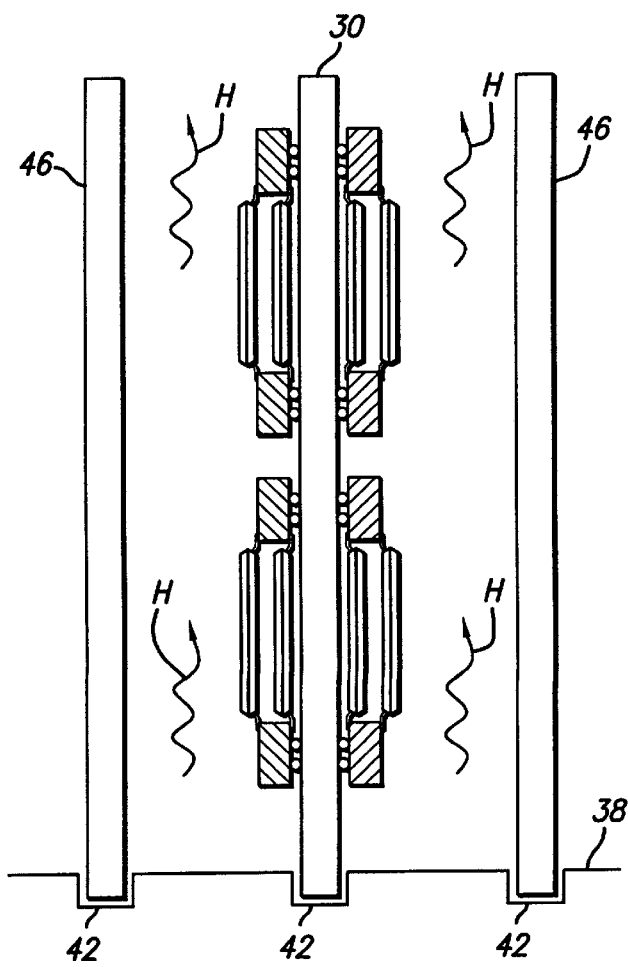

MULTI-CHIP PACKAGE WITH STACKED CHIPS AND INTERCONNECT BUMPS

FIELD OF THE INVENTION

The present invention generally relates to the art of packaging integrated circuits and more specifically to a multi-chip package with stacked chips and a plurality of interconnect bumps.

BACKGROUND OF THE INVENTION

It is well known that in the electronics industry, particularly the personal computer industry, the trend is to design products which are smaller, lighter, and more compact while maintaining or increasing power, speed, and memory capacity. In recent years, the computer industry has experienced the advent of the lap-top computer, the notebook computer, and now the palm-top computer. Although these computers are amazingly compact and lightweight, they are still incredibly powerful and fast. They are capable of running software applications that only in the recent past were able to be run on desk-top computers with large amounts of memory.

Personal computers (including desk-top, lap-top, notebook, and palm-top computers) include a mother board for controlling the operation of the computer. Personal computers are sold with a specified amount of memory, for example 10 gigabytes (GB) of storage memory on a hard drive and 64 megabytes (MB) of random access memory (RAM). Mother boards typically include standardized slots in which boards for memory, sound, video, and graphics may be inserted.

In the case of memory boards or memory modules, a dual in-line memory module (DIMM) connector is a standard industry connector for receiving a module. In accordance with the "smaller-is-better" trend in the computer industry, many mother boards are equipped with only two DIMM connectors. As such, in order to install a large amount of memory in only two DIMM connectors, higher density memory modules have been developed. As used herein, the term "memory module" is not strictly limited to memory boards, but also includes similarly configured circuit boards designed for computers and computer related products which include integrated circuit chips.

One conventional technique for increasing the storage capacity of a memory module is to increase the height of the module. For example, the storage capacity of a memory module having two rows of memory chips can be increased by a factor of two by adding a third and fourth row of memory chips. However, there are two primary disadvantages of such a configuration. One disadvantage is the increase in height of the module. The housing of the computer and the area around the mother board both need to be sufficiently large in order to accommodate the increase in height of the module, which runs contrary to the small is better design principle. Another disadvantage lies in different trace lengths. A trace is the electrical conductor which connects the chips to the edge connector or interface portion of the module. In a triple row configuration, the first, second and third row of chips each have their own trace lengths such that the first row of chips being closest from the edge connector, the third row of chips being furthest from the edge connector, and the second row of chips being between the first and third row of chips. The trace of the third row of chips is essentially three times as long as the first row of chips. In a similar fashion, the trace of the second row of chips is essentially twice as long as the first row of chips. Accordingly, a signal traveling to the furthest row of chips takes about three times as long to arrive as the signal traveling to the first row of chips. This arrangement requires the signal delay to be eliminated, which may be done by synchronizing the signals, which is difficult and expensive to accomplish. Alternatively, the trace of the closer row of chips may be physically lengthened so that the signals arrive at the three rows at about the same time. Either solution results in a module which is limited in speed by the double and triple-length traces.

Another conventional technique for increasing the storage capacity of a memory module is to configure the double-height arrangement discussed above with a foldable portion such as an integral flex conductor. The module may then be folded in half, thereby reducing the height essentially by two. However, this foldable configuration still suffers from the drawback of the varying trace lengths. An additional drawback is created by the folded arrangement in that vertical air circulation is restricted. The components of the module produce heat, and under normal convection the heated air would rise and be drawn out of the computer by a fan. However, the folded portion of the module retains heat between the folded sections, which may cause the module to function improperly and errant.

In addition to memory modules and other types of boards, lap-top, notebook, and palm-top computers generally interface with PC cards such as RAM cards, ATA flash cards, modem cards, and various other types of cards. There is a particularly strong driving force to densely package the integrated circuit chips due to the relatively small size of the PC cards which are usually the size of a typical credit card. For the same reasons discussed above in regards to the memory modules for mother boards, it is preferable to increase chip capacity without increasing the dimensions of the PC card. For example, adding additional rows of memory chips would require a larger circuit board which would necessitate increasing the size of the PC card and varying the trace lengths. Using integral flex conductors may necessitate increasing the thickness of the PC card to an unacceptable level. The foldable configuration also suffers from the drawback of the varying trace lengths.

Accordingly, in view of the foregoing, it is an object of the present invention to provide an integrated circuit package which overcomes the disadvantages and drawbacks associated with conventional modules and circuit boards.

SUMMARY OF THE INVENTION

These and other objects are achieved by the apparatus of the present invention which provides a multi-chip package with stacked integrated circuit chips and a plurality of interconnect bumps. According to one aspect of the invention, the multi-chip package includes a substrate having an opening located about the central region of the substrate. At least two integrated circuit chips are mounted on the substrate. The first chip is mounted on one side of the substrate, while the second chip is mounted on the other side of the substrate. The chips are positioned within the opening and are vertically stacked. The bottom side of the substrate includes a plurality of interconnect bumps for providing electrical connection to a circuit board or other substrate.

In one of the embodiments, a plurality of multi-chip packages are mounted on a circuit board to form a module which may be inserted into a slot on a mother board of a computer. The exemplary module maximizes the speed at which the module operates, maximizes chip density per slot, and minimizes trace length. Although capable of performing all types of functions typical of modules, the module of the present invention is particularly suitable for the memory of a computer, either a desk-top, lap-top, notebook, or palm-top computer.

According to one aspect of the invention, an exemplary module includes a primary board with an interface portion for engaging with the slot. The interface portion may be configured to engage with a conventional 168-pin dual in-line memory module (DIMM) connector, for example. The primary board has electrical traces for interconnecting the multi-chip packages to the interface portion.

One of the advantages of the invention is that the air spaces allow air to circulate between the exemplary memory module and adjacent modules. Generally, the exemplary memory module and each of the adjacent modules have a plurality of chips mounted thereon which generate heat when operating. In addition, the computer in which the module is inserted is a closed environment with many electronic components which also generate heat. As temperature increases, the speed of a chip decreases due to increased electrical resistance. However, in accordance with the present invention, air is able to freely circulate between the exemplary memory module and adjacent modules, thereby either cooling the chips or at least providing ventilation to prevent the ambient temperature from increasing undesirably.

Another aspect of the present invention focuses on the traces. In addition to the traces of the substrate for the multi-chip package, the primary board has traces interconnecting the interface portion with the chips of the multi-chip package. Each pair of stacked chips in a multi-chip package substantially have the same total trace length, with the top chip having a slightly longer trace length that that of the bottom chip.

In contrast, a conventional memory module comprises individual chips directly attached to the primary board. In such a configuration, twice as many rows of individual chips have to be attached to the primary board to maintain the same chip density as a memory module comprising multi-chip packages having dual chips. The trace lengths for each of the chips should be within a minimum variance for timing purposes. One of the disadvantages of adding additional rows of chips to increase the chip density of a memory module is that the row of chips further away from the interface portion of the primary board have longer trace lengths than the row of chips closer to the interface portion. This feature of reducing the number of rows of chips advantageously reduces the need for synchronizing signals to different rows of chips. In addition, by way of example only, the module of the present invention may have trace length on an average by about 40% to 60% over conventional arrangement, or some other value consistent with operational parameters. The reduction in trace length results in a much faster operating module.

Other aspects, features, and advantages of the present invention will become apparent to those persons having ordinary skill in the art to which the present invention pertains from the following description taken in conjunction with the accompanying drawings.

BRIEF DESCRIPTION OF THE DRAWINGS

FIG. 4A is a schematic view of an exemplary module of the invention illustrating a plurality of stacked integrated circuit packages mounted on a first side of a board;

FIG. 4B is a view similar to that of FIG. 4A, illustrating a plurality of stacked integrated circuit packages mounted on a second side of the board;

FIG. 4C is a side view of the exemplary module illustrated in FIG. 4A;

FIG. 7 is a schematic view of the exemplary embodiment of an expansion module of the present invention, particularly illustrating the expansion module mounted in an expansion slot of a mother board of a computer which is illustrated schematically;

FIG. 8 is an enlarged view of a portion of the exemplary module illustrated in FIG. 4C, particularly illustrating minimized trace lengths; and FIG. 9 is a cross-sectional view of the exemplary module of the invention, particularly illustrating open air paths defined between boards in a spaced relationship.

DETAILED DESCRIPTION OF THE INVENTION

Figure 1:
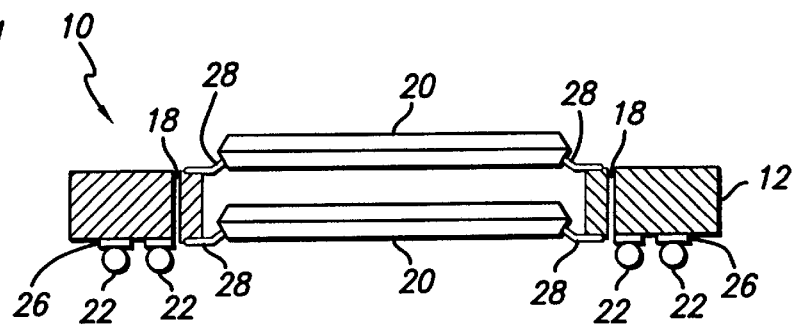
FIG. 1 is a cross-sectional view of an exemplary embodiment of a stacked integrated circuit package of the present invention.
Figure 2:
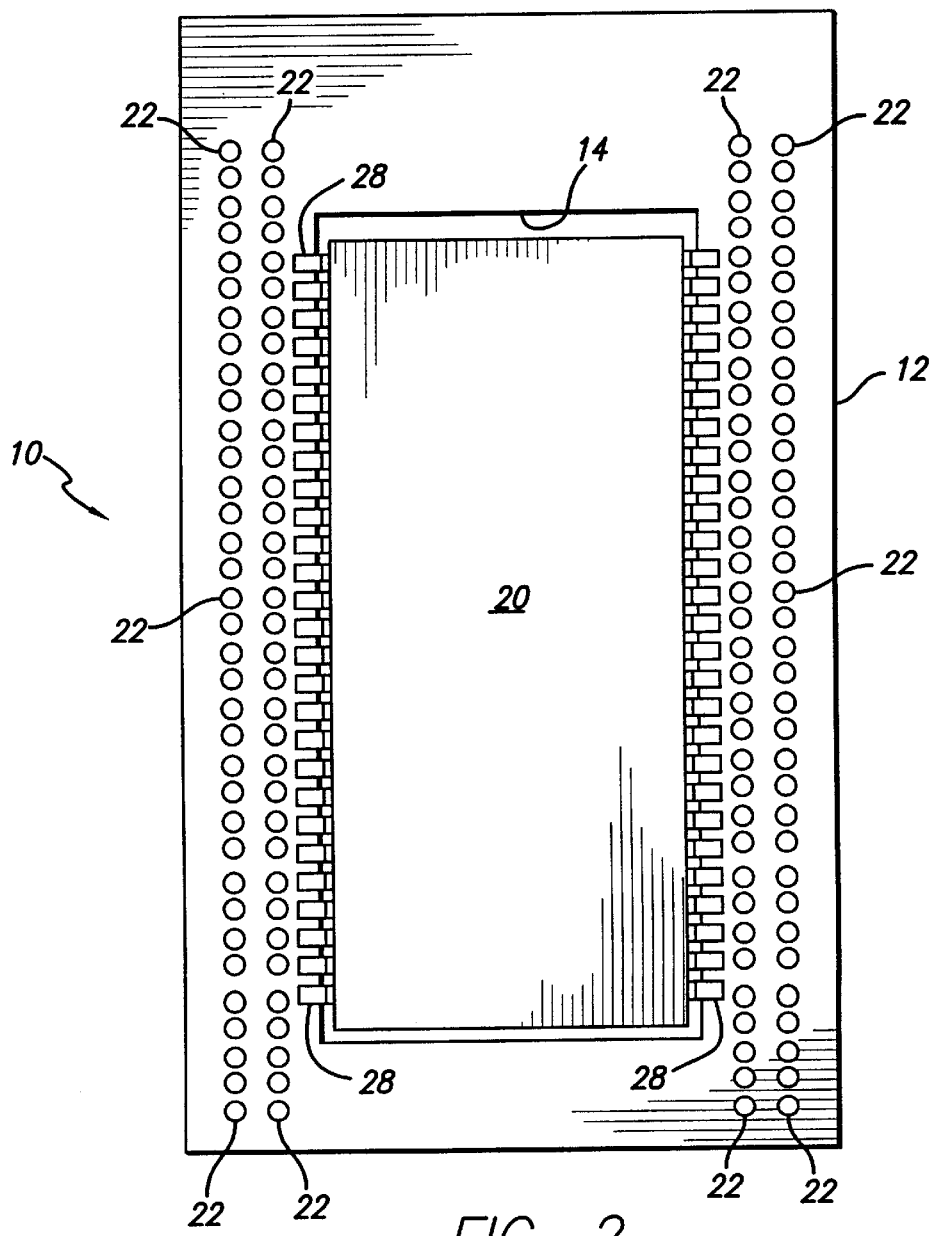
FIG. 2 is a bottom view of the exemplary embodiment shown in FIG. 1.
Figure 3A:
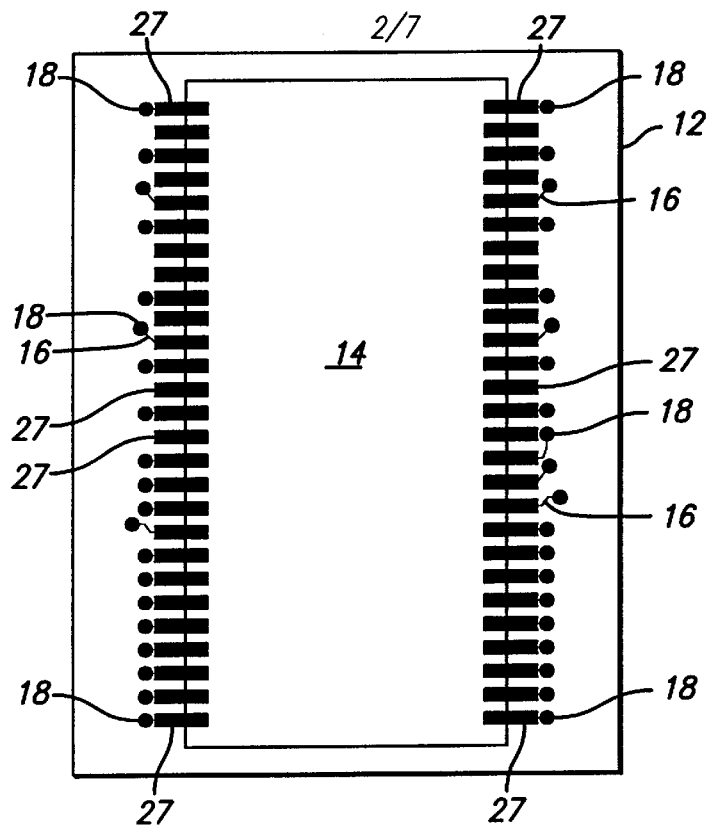
FIG. 3A is a top view of a substrate of the exemplary embodiment shown in FIG. 1 illustrating traces.
Figure 3B:
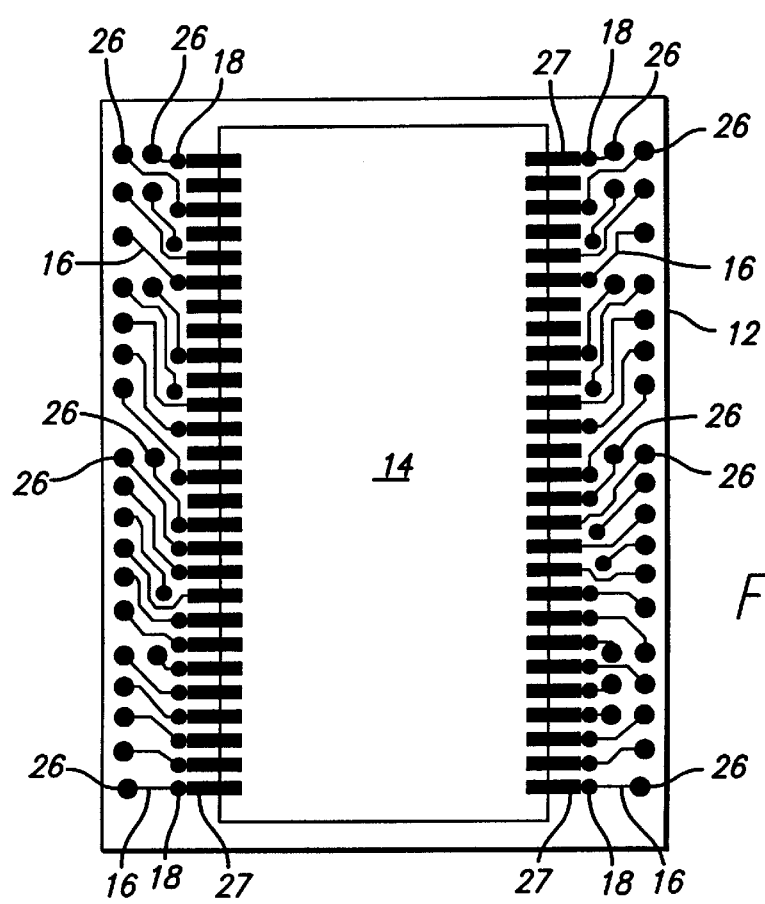
FIG. 3B is a bottom view of the substrate of the exemplary embodiment shown in FIG. 1 illustrating traces.
Figure 5:
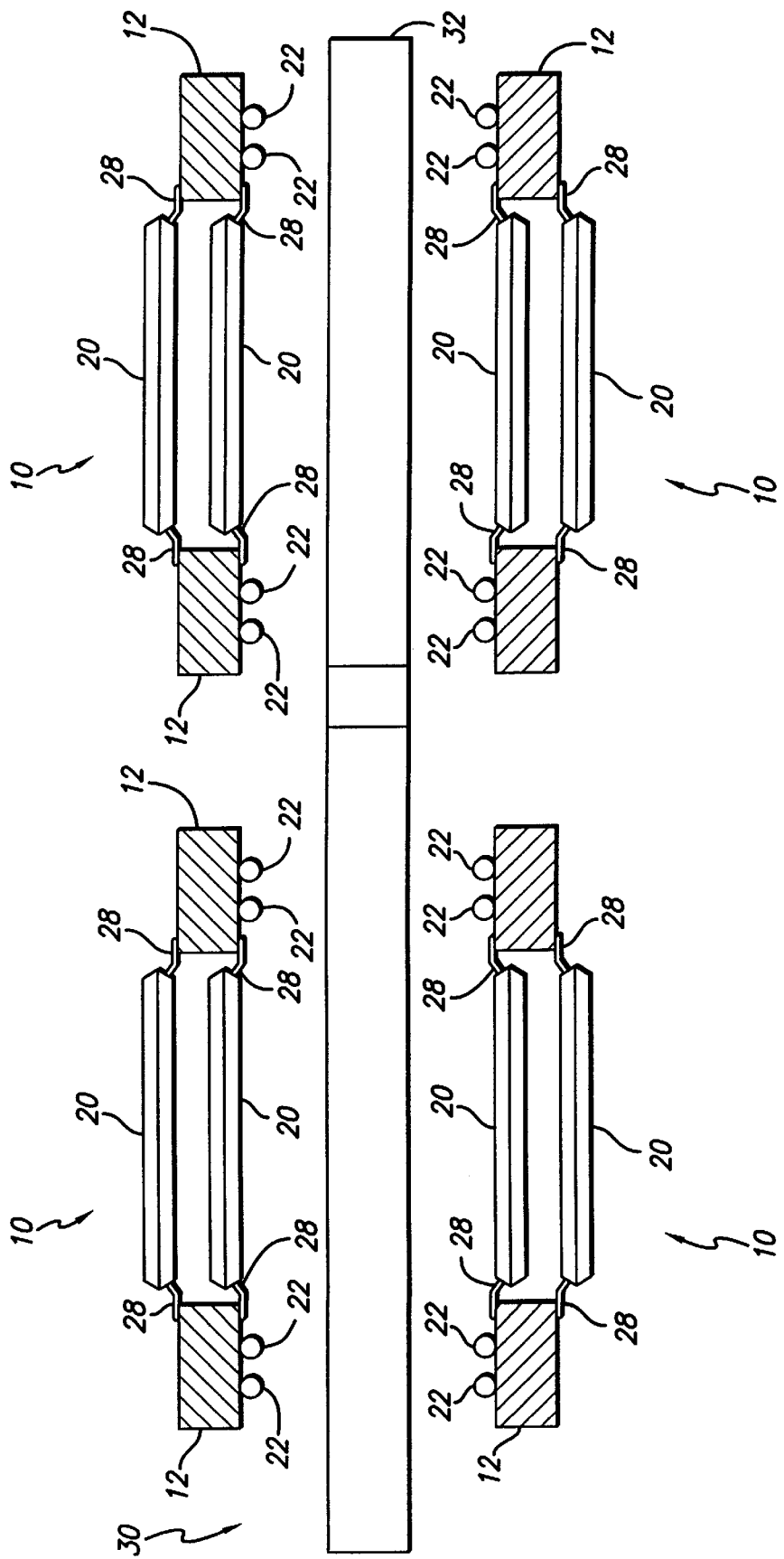
FIG. 5 is an exploded top view of the exemplary module illustrated in FIG. 3A.

Referring to the drawings in more detail, FIGS. 1 and 2 illustrate an exemplary embodiment of a multi-chip package 10 of the present invention. The multi-chip package 10 generally comprises a substrate 12 having an opening 14 about its central region. As illustrated in FIGS. 3A and 3B, the substrate 12 may include electrically conductive circuit patterns such as traces 16 on the bottom side and top side thereof, and they may be interconnected with via holes 18 or via plugs, or any other way known in the art. Two integrated circuit chips 20 are attached to the substrate 12. The first chip 20 is attached to the top side of the substrate 12, and the second chip 20 is attached to the bottom side of the substrate 12 such that the chips 20 are vertically stacked. A portion of the chip(s) 20 may be positioned within the opening 14. A plurality of interconnect bumps 22 such as solder bumps are attached to the bottom side of the substrate 12 for providing electrical connection and simultaneous physical mounting of the multi-chip package 10 to a circuit board or other structure. Other types of interconnects besides interconnect bumps may be employed provided that the components of the multi-chip package 10 do not electrically short with other electronic components such as a circuit board on which the multi-chip package 10 is mounted onto.

Generally, the substrate 12 is in the form of a printed circuit board (PCB) or a printed wiring board (PWB). However, ceramic or FR4 polyglass substrates may be used where applicable, or any other type known in the art. When using a PCB or PWB, the opening 14 can be formed by removing the appropriate portions of the substrate 12 by cutting, lasering, or other methods. The substrate 12 may also be formed by a molding process in which the opening 14 is formed integrally with the substrate 12 during the molding process.

The traces 16 that interconnect the various functional elements of the multi-chip package 10 may be formed by methods generally known in the art. For example, PCBs and PWBs generally have circuit patterns formed by masking and then plating a metallized layer. Traces 16 may be formed on ceramic substrates using a thick film screen printing process or a thin film process utilizing photolithographic techniques. The traces 16 may include an array of bump pads 26 for attachment to the interconnect bumps 22 and lead pads 27 for attachment to the leads 28 of the chips 20.

Each integrated circuit chip 20 may perform a particular function. For example, each chip 20 may be a memory chip so that the exemplary multi-chip package 10 is a high-density memory package. The first integrated circuit chip 20 is attached to the top side of the substrate 12, and the second integrated circuit chip 20 is attached to the bottom side of the substrate 12 such that the chips 20 are vertically stacked. A portion of the chip 20 or chips 20 may be positioned within the opening 14. One of the advantages of positioning a portion of the chip 20 or chips 20 within the opening 14 is that the height of the multi-chip package 10 is minimized. Preferably, the opening 14 is rectangularly shaped to conform with the shape of the chips 20.

It is noted that a substrate may include more than one opening and corresponding stacked-integrated chips. For example, the substrate 12 may include a row of three openings (not shown). Each of these openings will house a pair of stacked chips. Thus, a package configured in this manner will include six chips. It is also noted that the entire chip 20 or chips 20 may be positioned within the opening 14 with the exception of the leads 28. This configuration would be preferable in applications where packaging density is extremely critical such as for PC cards.

It is also noted that the substrate may include a depression rather than an opening. A depression may be preferable when relatively thick substrates are used for heat sink purposes. For example, the bottom side of a relatively thick substrate may include a depression sufficiently large to house at least a portion of an integrated circuit chip. The top surface of the chip may contact the surface of the depression such that heat is conducted from the chip to the relatively thick substrate. The depression may be formed by removing a portion of the substrate by machining, cutting, lasering, or other methods. The depression may also be formed integrally with the substrate if the substrate is formed by a molding process.

Referring to FIG. 1 each interconnect bump 22 is disposed upon and electrically connected to a corresponding electrical contact such as the bump pad 26. The interconnect bumps 22 may be formed as separate elements which are then placed onto the bump pads 26. The interconnect bumps 22 may be secured by a solder reflow operation in which the material of the interconnect bump 22 itself is melted to secure the interconnect bump 22 to the bump pad 26. Alternatively, the interconnect bumps 22 may be secured to the substrate 12 by providing a layer of lower melting temperature solder on the contacts and melting the lower melting temperature solder without melting the interconnect bumps 22 themselves. Still alternatively, a solder paste may be screen printed onto the bump pads 26. This solder paste is then coalesced into an interconnect bump 22 by heating. Surface tension causes the solder material to form into solder balls. Regardless of the method used to provide the interconnect bump 22 or the shape of the interconnect bump which could be spherical, rectangular, or other shapes, these contact members are herein referred to as "interconnect bumps".

Figure 6A:
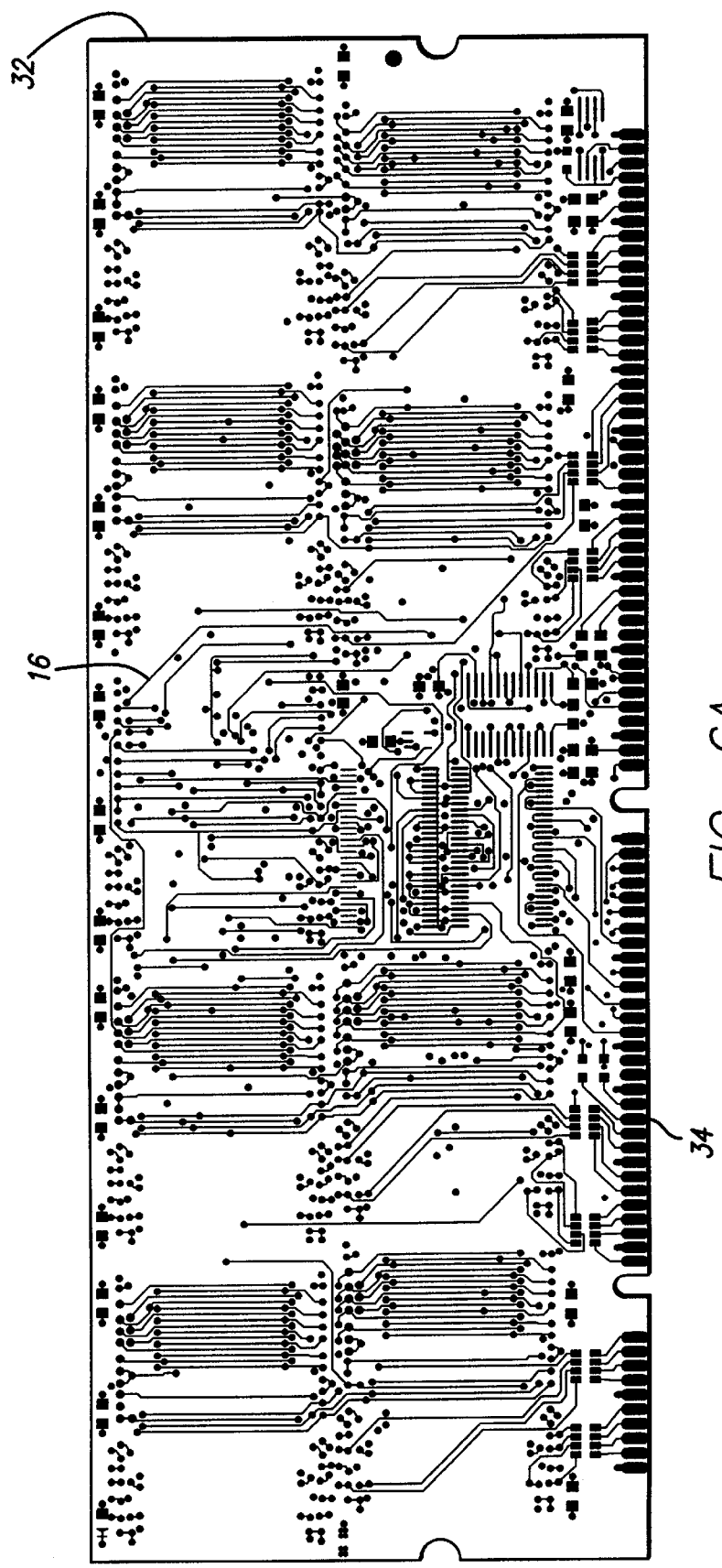
FIG. 6A is a schematic view of a board of the exemplary embodiment shown in FIG. 4A illustrating traces.
Figure 6B:
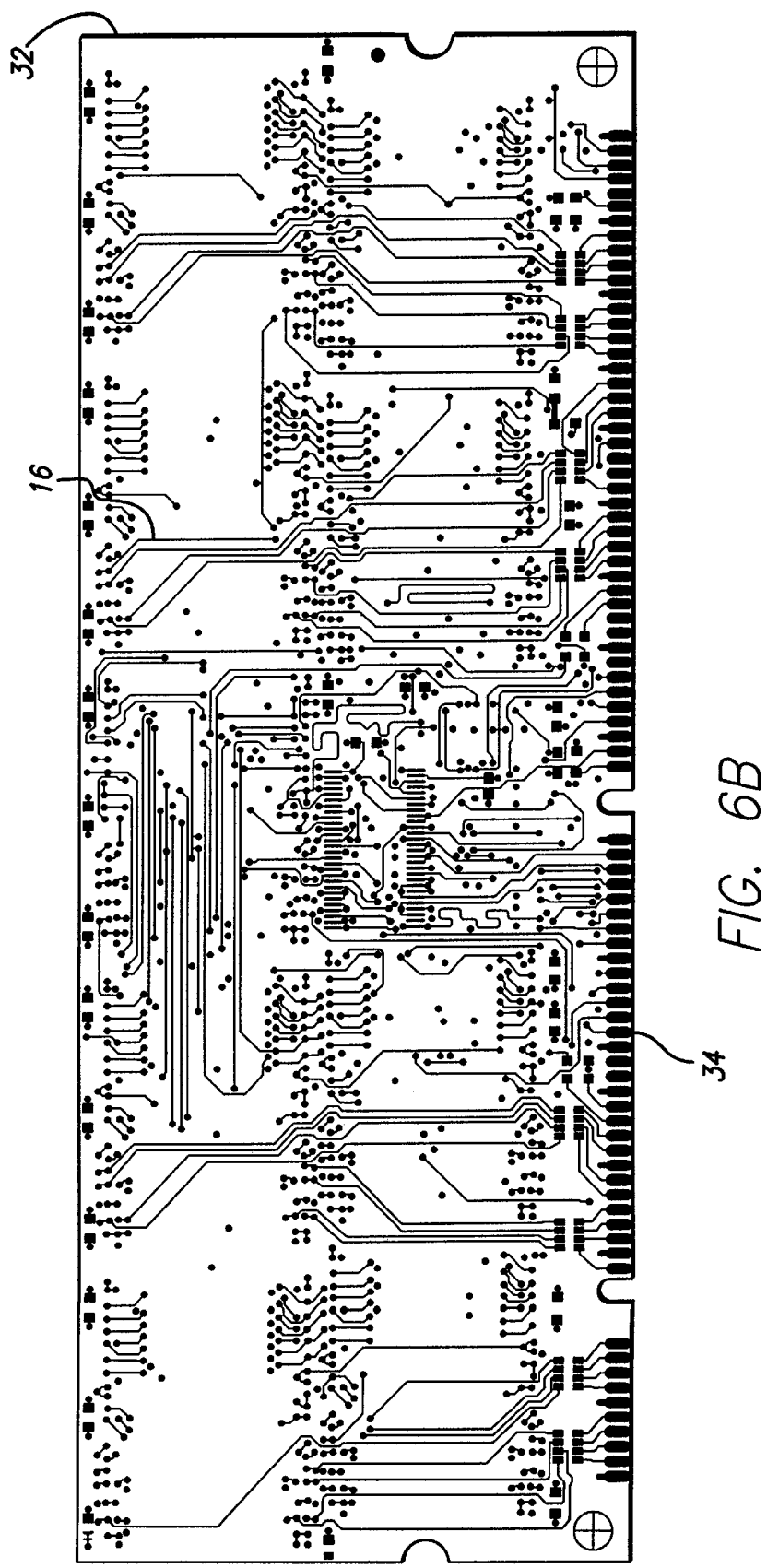
FIG. 6B is a view similar to that of FIG. 6A, illustrating traces on a second side of the board.

Referring to FIGS. 4A–4C and 5, an exemplary module 30 of the present invention is illustrated. The exemplary module 30 includes a primary board 32 such as a PCB or a PWB. However, other types of boards utilized in the computer industry may also be used. Attached to the back side and front side of the primary board 32 are a plurality of multi-chip packages 10 arranged in two rows. As illustrated in FIGS. 6A and 6B, circuit patterns or traces 16 are formed on the front side and backside of the primary board 32 for interconnecting the multi-chip packages 10 to a component or components external to the module 30. The traces 16 also include an electrical interface portion 34 for connecting with one of the slots of a mother board of a computer. It is noted that the present invention is not limited to attaching multi-chip packages 10 on both sides of the primary board 32. The multi-chip packages 10 may be attached to only one side of the primary board 32 if desired.

The module may also comprise multi-chip packages 10 which are themselves vertically stacked upon each other (not shown). For example, the interconnect bumps 22 of a first multichip package 10 may be attached to the top surface of a second multi-chip package 10, while the interconnect bumps 22 of the second multi-chip package 10 are attached to the primary board 32.

Referring to FIG. 7, a high density memory module 30 with multi-chip packages 10 of the present invention is illustrated. Exemplary module 30 is installable in a mother board 36 of a computer. As known in the art, mother board 36 includes a main board 3 8 with a microprocessor 40 mounted thereon. The mother board 36 may include a plurality of additional semiconductor chips and electronic components operatively associated with the microprocessor 40. These additional chips and components are not shown in the drawings for clarity. Also not shown in the drawings are components and peripheral devices which may be configured with the computer, including a monitor, input devices such as a keyboard and/or mouse, network connections, output devices such as a printer, and so on.

The mother board 36 also includes at least one but in general a plurality of slots 42 in communication with the microprocessor 40. The slots 42 may respectively receive modules for performing particular functions. For example, a memory module may be inserted in one of the slots to increase the amount of memory of the computer. The slots 42 are also known in the art as connectors. A 168-pin DIMM connector is an example of a standard slot or connector commonly used in the industry today. As computers become increasingly small and compact, particularly portable computers such as lap-top computers and now palm-top computers, many mother boards for desk-top computers are equipped with as few as two 168-pin DIMM connectors.

With further reference to FIG. 7, the art of chip fabrication allows microprocessors to operate at increasing high speeds. For example, microprocessors may operate on the order of hundreds of megahertz (Mhz). Accordingly, if the module is configured as a memory module, such as a synchronous dynamic random access memory (SDRAM), the memory module needs to operate at about 100 Mhz or more. Switching times at 100 Mhz are on the order of 10 nanoseconds (ns).

Electrical signals travel on the traces 16 from the electrical interface portion 34 for connecting with one of the slots 42 to the chips 20. A time (t) required for an electrical signal to travel from the electrical interface portion 34 to a chip 20 may be determined by dividing a length (l) of a trace 16 from the interface portion 34 to the chip 20 by a velocity (v) at which electrical signals travels, or $t=l/v$. As velocity v is substantially constant for the electrical signal, time t is substantially proportional to length (l), with the length being the variable in the equation. In order to maximize the speed at which the module operates, the time the electrical signals reach the chips 20 needs to be minimized. To minimize the time, trace length (l) needs to be minimized. The velocity of the electrical signal will vary inversely proportional to temperature, in that velocity decreases as temperature increases.

With reference to FIG. 8, the trace length (l) may be defined as the total length of the electrical connection extending from the edge connectors of the interface portion 34 of the primary board 32 to one of the chips 20. In accordance with this invention, a chip 20a has a trace 16 length $l_a$, and chip 20b has a trace length $l_b$ as shown by the dashed arrows. The exemplary module 30 is configured such that trace length $l_b$ is only slightly longer than trace length $l_a$. By utilizing the present invention, the trace lengths of the exemplary module 30 are shorter than the trace lengths of conventional modules. By way of example only, the trace lengths of the exemplary module 30 may be 40% to 60 less, or some other value consistent with operational parameters.

As mentioned above, the velocity v at which an electrical signal travels along a trace from the edge connector to a chip, and vice versa, is inversely proportional to temperature (T), that is, v (1/T). Accordingly, if temperature T increases, then velocity v decreases and the module operates at a slower speed. To maximize the speed, temperature needs to be minimized, or at least maintained within a predetermined operating range or specification. As shown in FIG. 9, the exemplary module 30 is illustrated mounted on the slot 42 of the mother board 36. In operation, the chips 20 generate heat. If the generated heat is not ventilated, then the ambient temperature around the exemplary module 30 will increase, thereby decreasing the speed of the exemplary module 30.

According to the present invention, the configuration of the exemplary module 30 defines an air path between the exemplary module 30 and the adjacent modules. Air paths are open along the top and bottom edges of the primary board 32 and promote circulation and allow heat (which is shown by cursive arrows and reference alpha H) to rise and escape. As discussed above, the air flow of conventional modules having an integral flex conductor section extending along top edges and between a pair of boards is substantially reduced. The closed section of the flex conductor prevents or substantially reduces air circulation and traps the heat between the boards, thereby greatly increasing the ambient temperature at the module and, correspondingly, decreasing the speed. Increased temperature may also cause the modules to malfunction.

Referring to FIGS. 4A–4C, one of the preferred commercial embodiments of exemplary module 30 is a memory module for a computer. As such, the chips 20 may be synchronous dynamic Ram (SDRAM) chips. The exemplary module 30 may also include a plurality of damping resistor packages configured with the SDRAM chips. One of the advantages of the present invention is that the amount of memory per module and memory per unit volume is maximized. For example, the exemplary memory module 30 may include more than 2,048 MB for a standard 168-pin DIMM configuration. However, the exact capacity of the module may be varied, as is known in the art, depending upon the capacity of the components as they are developed in the future, and could be much larger. As the art of chip fabrication advances, it is obvious to those skilled in the art that more memory will be able to be included on the module.

Those skilled in the art will understand that the embodiments of the present invention described above exemplify the present invention and do not limit the scope of the invention to these specifically illustrated and described embodiments. The scope of the invention is determined by the terms of the appended claims and their legal equivalents, rather than by the described examples. In addition, the exemplary embodiments provide a foundation from which numerous alternatives and modifications may be made, which alternatives and modifications are also within the scope of the present invention as defined in the appended claims.

What is claimed is:

1. A module for mounting in a slot of a mother board of a computer, said module comprising:
    a board having an interface portion for engaging with said slot;
    a plurality of multi-chip packages mounted on said board, said plurality of multi-chip packages arranged in a row along and adjacent to said interface portion of said board, each of said plurality of said multi-chip packages comprising:
        a substrate;
        a first integrated circuit chip connected to a first side of said substrate;
        a second integrated circuit chip connected to a second side of said substrate;
        wherein said second chip is positioned below said first chip;
        a plurality of interconnect bumps on said second side of said substrate, each bump having a first end and a second end, said first end attached to said second side of said substrate;
        said substrate directly mounted on said board, wherein said second end of each interconnect bump is attached to said board; and
    traces on said board electrically interconnecting said plurality of multi-chip packages to said interface portion, said traces being substantially equal in length.

2. The module of claim 1, further comprising an opening in said substrate, wherein said second chip is positioned within said opening.

3. The module of claim 1 being a RAM memory module, wherein said first and second chip are memory chips, and said board and said substrate are printed circuit boards.

4. The module of claim 1, wherein said traces include pads, and said plurality of interconnect bumps being attached to said pads.

5. The module of claim 1 being a 168-pin dual in-line memory module (DIMM).

6. A module for mounting in a slot of a mother board of a computer, said module comprising:
    a board having an interface portion for engaging with said slot;
    a plurality of multi-chip packages mounted on said board to form two rows of said multi-chip packages on each side of said board, each of said plurality of said multi-chip packages comprising:
        a substrate;
        a first integrated circuit chip connected to a first side of said substrate;
        a second integrated circuit chip connected to a second side of said substrate;
        wherein said second chip is positioned below said first chip;
        a plurality of interconnect bumps on said second side of said substrate, each bump having a first end and a second end, said first end attached to said second side of said substrate;

said substrate directly mounted on said board, wherein said second end of each interconnect bump is attached to said board; and traces interconnecting said plurality of multi-chip packages to said interface portion.

7. The module of claim 6, wherein said traces are substantially equal in length.

8. The module of claim 6, further comprising an opening in said substrate, wherein said second chip is positioned within said opening.

9. The module of claim 6 being a RAM memory module, wherein said first and second chip are memory chips, and said board and said substrate are printed circuit boards.

10. The module of claim 6, wherein said traces include pads, and said plurality of interconnect bumps being attached to said pads.

11. The module of claim 6 being a 168-pin dual in-line memory module (DIMM).

12. A package comprising:
a board having an interface portion;
a plurality of multi-chip packages mounted on said board along said interface portion of said board, each of said plurality of multi-chip packages comprising:
a substrate having a first side and a second side;
a first integrated circuit chip connected to said first side of said substrate;
a second integrated circuit chip positioned below said first chip and within an opening of said substrate, said second chip connected to said second side of said substrate; and
a plurality of interconnect bumps, each bump having a first end and a second end, said first end attached to said second side of said substrate; and
each of said multi-chip packages directly mounted on said board, wherein said second end of each interconnect bump is attached to said board; and
traces interconnecting each of said multi-chip packages to said interface portion, wherein the length of said traces is substantially equal.

13. A package comprising:
a board having an interface portion;
a plurality of multi-chip packages mounted on said board in a row and column fashion, each of said plurality of multi-chip packages comprising:
a substrate having a first side and a second side;
a first integrated circuit chip connected to said first side of said substrate;
a second integrated circuit chip positioned below said first chip and within an opening of said substrate, said second chip connected to said second side of said substrate; and
a plurality of interconnect bumps, each bump having a first end and a second end, said first end attached to said second side of said substrate; and
each of said multi-chip packages directly mounted on said board, wherein said second end of each interconnect bump is attached to said board; and
traces interconnecting each of said multi-chip packages to said interface portion.

14. The package of claim 13, wherein the length of said traces is substantially equal.

15. The multi-chip package of claim 13, where each said first and second chip includes a single lead frame package.

16. The multi-chip package of claim 15, wherein the first and second chips include leads, a bottom surface of said leads of said first chip are attached to said first side of said substrate, and a top surface of said leads of said second chip are attached to said second side of said substrate.

17. A method of forming a module, comprising the steps of:
(a) providing a first board;
(b) forming an opening in the first board;
(c) connecting a first integrated circuit chip to a first side of the first board;
(d) connecting a second integrated circuit chip to a second side of the first board such that the second chip is positioned below the first chip;
(e) disposing at least a portion of the second circuit chip within the opening;
(f) providing a plurality of interconnect bumps on the second side of the first board, each interconnect bump having a first end and a second end, the first end being attached to the second side of the first board;
(g) providing a second board;
(h) mounting the first board directly on the second board, wherein the second end of each interconnect bump is attached to the second board;
(I) repeating steps (a) through (h) to form a plurality of multi-chip packages;
(j) arranging the multi-chip packages in rows; and
(k) forming traces which interconnect the multi-chip packages to an interface portion of the second board, wherein the length of the traces is substantially equal.

18. The method of claim 17, wherein the module is a memory module, and the first chip and the second chip are memory chips.

19. The method of claim 17, wherein the first board and the second board are printed circuit boards.

20. A method of forming a module, comprising the steps of:
(a) providing a first board;
(b) connecting a first integrated circuit chip to a first side of the first board;
(c) forming a depression on a second side of the first board;
(d) connecting a second integrated circuit chip to the second side of the first board such that the second chip is positioned below the first chip;
(e) disposing at least a portion of the second chip within the depression;
(f) providing a plurality of interconnect bumps on the second side of the first board, each interconnect bump having a first end and a second end, the first end being attached to the second side of the first board;
(g) providing a second board;
(h) mounting the first board directly on the second board, wherein the second end of each interconnect bump is attached to the second board;
(i) repeating steps (a) through (h) to form a plurality of multi-chip packages;
(j) arranging the multi-chip packages in rows; and
(k) forming traces which interconnect the multi-chip packages to an interface portion of the second board, wherein the length of the traces is substantially equal.

21. The method of claim 20, wherein the module is a memory module, and the first chip and the second chip are memory chips.

22. A method of forming a multi-chip package, comprising the steps of:
   (a) providing a substrate having a first side and a second side;
   (b) forming an opening in the substrate;
   (c) connecting a first integrated circuit chip to the first side of the substrate;
   (d) connecting a second integrated circuit chip to the second side of the substrate such that the second chip is disposed below the first chip, whereby substantially all of the second chip is disposed within the opening; and
   (e) providing a plurality of interconnect bumps on the second side of the substrate, each interconnect bump having a first end and a second end, the first end being attached to the second side of the substrate.

23. The method of claim 22, wherein the multi-chip package is a multi-chip memory package, and the first chip and second chip are memory chips.

* * * * *